(12) United States Patent
Saito

(10) Patent No.: US 7,060,602 B2
(45) Date of Patent: Jun. 13, 2006

(54) METHOD OF MANUFACTURING ELECTRONIC PART AND MOUNTING ELECTRONIC PART

(75) Inventor: Atsushi Saito, Chino (JP)

(73) Assignee: Seiko Epson Corporation, Tokyo (JP)

(*) Notice: Subject to any disclaimer, the term of this patent is extended or adjusted under 35 U.S.C. 154(b) by 108 days.

(21) Appl. No.: 10/809,515

(22) Filed: Mar. 26, 2004

(65) Prior Publication Data

US 2004/0224441 A1    Nov. 11, 2004

(30) Foreign Application Priority Data

Mar. 26, 2003  (JP) ............... 2003-085874

(51) Int. Cl.
 *H01L 21/44*  (2006.01)
(52) U.S. Cl. .............. 438/612; 438/613; 438/614; 438/108
(58) Field of Classification Search ........ 438/612–614, 438/108
See application file for complete search history.

(56) References Cited

U.S. PATENT DOCUMENTS 5,844,314 A * 12/1998 Kim ............... 257/737
6,213,386 B1   4/2001 Inoue et al.
6,228,689 B1 * 5/2001 Liu ............... 438/131
2003/0067072 A1 * 4/2003 Ono et al. .......... 257/737

FOREIGN PATENT DOCUMENTS

| CN | 1267395 A | 9/2000 |
| JP | A 7-006799 | 1/1995 |
| JP | A 10-084178 | 3/1998 |
| JP | A 2002-170837 | 6/2002 |
| JP | A-2003-059959 | 2/2003 |
| JP | A 2003-124259 | 4/2003 |
| WO | WO 99/10928 | 3/1999 |

* cited by examiner

*Primary Examiner*—Thanh Nguyen
(74) *Attorney, Agent, or Firm*—Oliff & Berridge, PLC

(57) ABSTRACT

To provide a method of manufacturing an electronic part capable of reusing the remaining conductive particles and electrically connecting the electronic part to the counterpart substrate, a method of manufacturing an electronic part includes: forming a mask on an active surface of the wafer on which electrode pads of the electronic part are formed, the mask of a predetermined height having openings provided above the electrode pads, forming bumps inside of the openings of the mask provided above the electrode pads, the bumps having a height lower than that of the mask, scattering conductive particles above the active surface of the wafer, removing the conductive particles remaining on the surface of the mask, fixing the conductive particles on the surfaces of the bumps, removing the mask, and separating the electronic part from the wafer.

32 Claims, 9 Drawing Sheets

F I G. 1
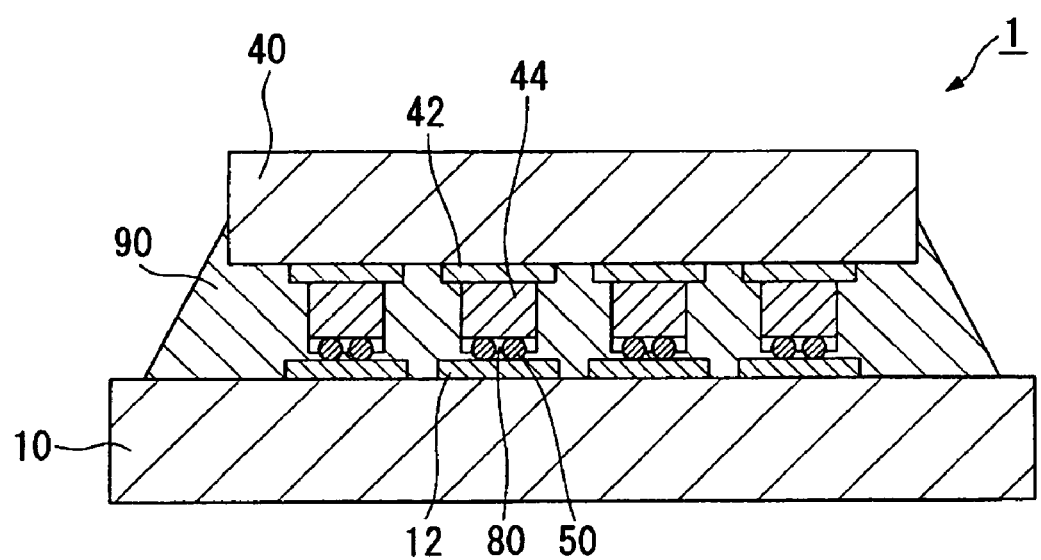

F I G. 3
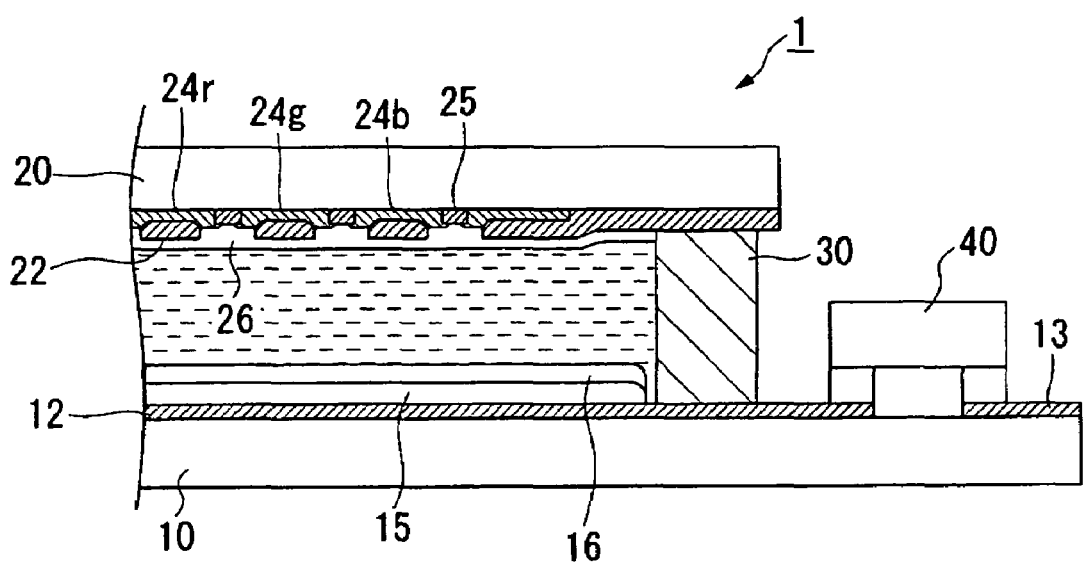

METHOD OF MANUFACTURING ELECTRONIC PART AND MOUNTING ELECTRONIC PART

BACKGROUND OF THE INVENTION

1. Field of Invention

The present invention relates to a method of manufacturing an electronic part, the electronic part manufactured according to the method, a method of mounting the electronic part, and an electronic apparatus.

2. Description of Related Art

Electronic parts, such as an IC, etc. are mounted onto a circuit board etc. for use. Various methods are proposed to mount the electronic part onto the circuit board. FIG. 9 shows a view for explaining a method of mounting the electronic part according to the related art. As shown in FIG. 9(A), the electronic part 170, such as the IC, etc. is mounted onto the counterpart substrate 120 while interposing an anisotropic conductive film (ACF) 190 therebetween. Conductive particles 195 distributed in a thermosetting resin 192 form the anisotropic conductive film 190. The conductive particles 195 are interposed between the electrode pad 172 formed on the active surface of the electronic part 170 and the electrode pad 122 formed on the surface of the counterpart substrate 120, thereby the electrode pads are electrically connected. Also, due to the thermosetting resin 192 thermally set by heating, the counterpart substrate 120 is mechanically connected to the electronic part 170.

Recently, as electronic parts have become smaller, the electrode pads must be arranged with a finer pitch. Since the conductive particles 195 are arranged between the electrode pads which are neighboring horizontally, the mounting method using the anisotropic conductive film can cause a short circuit between adjacent the electrode pads. Also, as the pitch of the pattern of the electrode pads becomes finer, the electrode pad itself becomes smaller, so the number of conductive particles contacted by the electrode pads is decreased and the reliability of the electrical connection is reduced. Also, the expensive conductive particles cannot be used for all of the electrical connection.

Herein, Japanese Unexamined Patent Application Publication No. 7-6799, Japanese Unexamined Patent Application Publication No. 10-84178 and Japanese Unexamined Patent Application Publication No. 2002-170837 disclose structures that do not arrange the conductive particles between the neighboring electrode pads because the conductive particles are previously bonded to the surface of the electrode pad of the electronic part before the part is mounted to the counterpart substrate.

FIG. 9(B) shows a view for explaining a mounting method disclosed in Japanese Unexamined Patent Application Publication No. 2002-170837. In this mounting method, adhesive conductive particles 298 are formed by coating the conductive particles 295 with an adhesive 296, and the adhesive conductive particles 298 are fixed onto the surface of the electrode pad 272 of the electronic part 270. The fixing method is as follows: First, a resist film 280 is formed on a portion of the active surface of the electronic part 270 excluding the formation portion of the electrode pad 272. Next, the adhesive conductive particles 298 are distributed on the surface of the electronic part 270 and heated and pressed to bond the distributed adhesive conductive particles 298 thereon. Thereby, the adhesive conductive particles 298 are fixed on the entire active surface of the electronic part 270. Next, the resist film 280 is removed together with the adhesive conductive particles 298 fixed on the surface of the resist film 280, leaving the adhesive conductive particles which are fixed to the electrode pad 272. Therefore, the adhesive conductive particles 298 are fixed only on the surface of the electrode pad 272. The position of the remaining adhesive conductive particles 298 to be connected with the electrode pad 222 of the counterpart substrate 220 is determined, and then the electronic part 270 is pressed to the counterpart substrate 220 with heat. Thus, as the adhesives 296 of the adhesive conductive particles 298 are dissolved, the electronic part 270 mechanically connects to the counterpart substrate 220 and at the same time they are electrically connected by the disposed conductive particles 295.

SUMMARY OF THE INVENTION

However, in the mounting method disclosed in the Japanese Unexamined Patent Application Publication No. 2002-170837, since the adhesive conductive particles 298 fixed on the surface of the resist film 280 are removed together with the resist film 280 as mentioned above, it has a disadvantage in that the unused adhesive conductive particles 298 cannot be used again. Also, since unused adhesive conductive particles 298 must be discarded despite the high cost of conductive particles 295 and even higher cost of the adhesive conductive particles 298 formed as the conductive particles 295 are coated with adhesive 296, its manufacturing cost is excessive.

Also, in the mounting method disclosed in the Japanese Unexamined Patent Application Publication No. 2002-170837, even though the adhesive conductive particles 298 are distributed on the surface and fixed thereon as the electronic part 270 is pressed with heat as mentioned above, it is difficult to uniformly distribute the adhesive conductive particles 298 on the surface. If the adhesive conductive particles 298 are not distributed uniformly, there is a possibility that the adhesive conductive particles 298 may not be arranged on the surface of the electrode pad 272 of the electronic part 270. Thereby it has a problem that it is impossible to electrically connect the counterpart substrate 220 with the electronic part 270.

The present invention is directed to address such a problem. Accordingly, the present invention provides methods of manufacturing electronic parts and the electronic part manufactured thereby, which is capable of reusing remaining conductive particles and electrically connecting the electronic part to a counterpart substrate.

Also, the present invention provides methods of mounting the electronic part, being capable of reducing or preventing shorting between adjacent electrode pads. Further still the present invention provides an electronic apparatus having the effects above.

In order to achieve the above, there is provided a method of manufacturing the electronic part from a wafer according to an aspect of the present invention, that includes: forming a mask on an active surface of the wafer on which electrode pads for the electronic part are formed, the mask being of a predetermined height and having openings provided above the electrode pads, forming bumps inside of the openings of the mask provided above the electrode pads, the bumps having a height lower than that of the mask, scattering conductive particles on the active surface of the wafer, removing the conductive particles remaining on the surface of the mask, fixing the conductive particles on the surfaces of the bumps, removing the mask, and separating the electronic part from the wafer.

From the configuration above, even though the conductive particles are scattered on the surface of the mask, since the mask is removed after the conductive particles are removed, the remaining conductive particles can be reused. Also, since the height of the bumps is less than that of the mask, a depressed portion is formed on the upper side of the bumps using the mask for the bumps formation. In this case, since most of the scattered conductive particles are held on the depressed portion, the conductive particles are arranged on the surfaces of the bumps. Accordingly, the electronic part and the counterpart substrate are electrically connected to each other.

The method according to an aspect of the present invention may include forming a metal film on the surfaces of the bumps before f scattering the conductive particles, the fixing of the conductive particles on the surfaces of the bumps includes fixing the conductive particles on the surfaces of the bumps by solidifying the metal after melting thereof Also, the formation of the metal film may be performed by a sputtering or vacuum deposition, plating method, etc.

Also, the method according to an aspect of the present invention may include coating a plastic resin on the surfaces of the bumps before the scattering of the conductive particles, the fixing of the conductive particles on the surfaces of the bumps including fixing the conductive particles on the surfaces of the bumps by curing the plastic resin after plasticizing thereof.

Also, the method according to an aspect of the present invention may include coating of a curable resin on the surfaces of the bumps before the scattering of the conductive particles, the fixing of the conductive particles on the surfaces of the bumps including fixing the conductive particles on the surfaces of the bumps by curing the curable resin.

From the configuration above, since the conductive particles are fixed on the surfaces of the bumps, the electronic part and the counterpart substrate are electrically connected to each other.

Also, the fixing of the conductive particles on the surfaces of the bumps may be performed while pressing the conductive particles against the surfaces of the bumps. Thereby, since the conductive particles are fixed on the surfaces of the bumps while in contact, and the conductive particles are surely electrically connected to the surfaces of the bumps, the electronic part and the counterpart substrate can be electrically connected with each other.

Also, the method according to an aspect of the present invention may include coating of a liquid material containing a metal on the surfaces of the bumps after the scattering of the conductive particles, the fixing of the conductive particles on the surfaces of the bumps including fixing the conductive particles on the surfaces of the bumps by solidifying the metal. Also, as a liquid material containing metal, the metal may preferably be in a paste form.

Also, the method according to an aspect of the present invention may include coating of a plastic resin on the surfaces of the bumps after the scattering of the conductive particles, the fixing of the conductive particles on the surfaces of the bumps including fixing the conductive particles on the surfaces of the bumps by curing the plastic resin.

Also, the method according to an aspect of the present invention may include coating of a curable resin on the surfaces of the bumps after the scattering of the conductive particles, the fixing of the conductive particles on the surfaces of the bumps including fixing the conductive particles on the surfaces of the bumps by curing the curable resin.

From the configuration above, since the conductive particles are fixed on the surfaces of the bumps, the electronic part and the counterpart substrate are electrically connected to each other.

The method according to an aspect of the present invention may include forming a metal film on the surfaces of the bumps before the scattering of the conductive particles, and coating a liquid material containing the metal on the surfaces of the bumps after the scattering of the conductive particles, the fixing of the conductive particles on the surfaces of the bumps including fixing the conductive particles on the surfaces of the bumps by solidifying the metal after melting thereof.

The method according to an aspect of the present invention may include coating a plastic resin on the surfaces of the bumps before the scattering of the conductive particles, and coating the plastic resin on the surfaces of the bumps after the scattering of the conductive particles, the fixing of the conductive particles on the surfaces of the bumps including fixing the conductive particles on the surfaces of the bumps by curing the plastic resin after plasticizing thereof.

Also, the method according to an aspect of the present invention may include coating a curable resin on the surfaces of the bumps before the scattering of the conductive particles, and coating the curable resin on the surfaces of the bumps after the s scattering of the conductive particles, the fixing of the conductive particles on the surfaces of the bumps including fixing the conductive particles on the surfaces of the bumps by curing the curable resin.

From the configuration above, the conductive particles are fixed on the surfaces of the bumps. Thereby, when the mask is removed, the conductive particles arranged on the bumps together with thermoplastic resin are not removed from the bumps. Accordingly, the electronic part and the counterpart substrate are electrically connected to each other.

Also, the fixing of the conductive particles on the surfaces of the bumps may be performed while pressing the conductive particles against the surfaces of the bumps. Thereby, since the conductive particles are fixed on the surfaces of the bumps while in contact, and the conductive particles are electrically connected to the surfaces of the bumps, the electronic part and the counterpart substrate can be electrically connected with each other.

Also, the coating of the plastic resin or the curable resin may include coating the liquid material which is prepared by dissolving the plastic resin or the curable resin in a solvent, the solvent being evaporated after the coating of the plastic resin or the curable resin.

Also, the curable resin may be a cured curable resin. In particularly, since a cured polyimide has a higher tolerance with respect to the solution used for removal of the mask, it is suitable to use for the curable resin. In this case, pyrrolidone, etc. may be used as a solvent.

From the configuration above, the plastic resin or curable resin is easily coated.

Also, the coating of the plastic resin or the curable resin may include coating the liquid material containing the plastic resin or the curable resin on the bumps by a droplet ejection apparatus. Also, an ink jet apparatus may be used as a droplet ejection apparatus. From the configuration above, only a predetermined amount of the plastic resin or curable resin may be coated on a predetermined position. Thereby, since the fixing state of the conductive particles becomes even, the electronic part and the counterpart substrate are surely electrically connected to each other.

Also, the scattering of the conductive particles may include scattering the conductive particles coated with the metal, and the fixing of the conductive particles on the surfaces of the bumps may include fixing the conductive particles on the surfaces of the bumps by solidifying the metal after melting thereof. Also, when a metal is solder, flux is coated on the surfaces of the bumps before the scattering of the conductive particles and reflow is preferably performed in the fixing of the conductive particles.

Also, the scattering of the conductive particles may include scattering the conductive particles coated with a plastic resin, and the fixing of the conductive particles on the surfaces of the bumps may include fixing the conductive particles on the surfaces of the bumps by curing the plastic resin after plasticizing thereof.

Also, the scattering of the conductive particles may include scattering the conductive particles coated with an uncured curable resin, and the fixing of the conductive particles on the surfaces of the bumps may include fixing the conductive particles on the surfaces of the bumps by curing the curable resin.

Also, the scattering of the conductive particles may include scattering the conductive particles coated with the cured curable resin, and the fixing of the conductive particles on the surfaces of the bumps may include fixing the conductive particles on the surfaces of the bumps by coating a solvent capable of dissolving the curable resin.

From the configuration above, since the conductive particles are certainly fixed on the surfaces of the bumps, the electronic part and the counterpart substrate are surely electrically connected to each other.

Also, the metal may be metal having a lower meting point, such as indium (In), tin (Sn), zinc (Zn) etc. or an alloy thereof including solder. In this case, since the metal can be melted at a lower temperature, damage to the electronic part can be controlled. Especially, tin (Sn) is suitable to use for the metal because it has a good wettability and melted at a lower temperature of about 230° C.

Also, the plastic resin may be a thermoplastic resin, such as polyamide, etc. In this case, the plastic resin is simply plasticized by heating. The polyamide is especially suitable to use for the plastic resin because it has a higher tolerance with respect to the solution used for removal of the mask, and becomes soft at a lower temperature of about 150 to 200° C. In this case, toluene/alcohol, etc. may be used as a solvent.

Also, the curable resin may be a thermosetting resin, such as epoxy etc. In this case, the curable resin is simply cured by heating. Epoxy is especially suitable to use for the curable resin for the reasons that it has a higher tolerance with respect to the removal solution of the mask and is cured at a lower temperature of about 150 to 200° C. In this case, toluene/alcohol etc. as a solvent may be used therefor.

Also, the curable resin may be a photo-curable resin, such as acryl, etc. In this case, the curable resin can be simply cured by irradiating a light, such as ultraviolet etc.

Also, the method according to an aspect of the present invention may include moving the conductive particles scattered on the surface of the mask to the surfaces of the bumps by vibrating the wafer after the scattering of the conductive particles.

Also, the vibrating of the wafer may include vibrating the wafer at a frequency of 50 Hz to 1000 Hz.

From the configuration above, since it is possible to arrange a relatively larger number of the conductive particles on the surfaces of the bumps, the electronic part and the counterpart substrate are electrically connected to each other.

Also, the vibrating of the wafer may include vibrating the wafer in parallel to the active surface of the wafer with an amplitude of not more than a width of the opening in the mask.

Also, the vibrating of the wafer may include vibrating the wafer perpendicularly to the active surface of the wafer with an amplitude of not more than the difference between the height of the mask and that of the bump.

From the configuration above, the conductive particles arranged on the surfaces of the bumps are not permitted to escape to the surface of the mask by the vibration of the wafer. Therefore, since it is possible to arrange a relatively larger number of the conductive particles on the surfaces of the bumps, the electronic part and the counterpart substrate are electrically connected to each other.

Also, the removing of the conductive particles remaining on the surface of the mask may include removing the conductive particles remaining on the surface of the mask by blowing gas on the active surface of the wafer.

Also, the removing of the conductive particles remaining on the surface of the mask may include removing the conductive particles remaining on the surface of the mask by vibrating the wafer.

Also, the removing of the conductive particles remaining on the surface of the mask may include removing the conductive particles remaining on the surface of the mask by vibrating the wafer while it is sloped.

Also, as mentioned above, when the wafer is vibrated so that the conductive particles scattered on the surface of the mask are moved into the surfaces of the bumps, as the amplitude is gradually increased, the conductive particles remaining on the surface of the mask may be removed.

Also, the removing of the conductive particles remaining on the surface of the mask may include removing the conductive particles as the conductive particles remaining on the surface of the mask are scraped off. Also, it is preferably to use a squeegee to scratch the conductive particles.

From the configuration above, most of the conductive particles remaining on the surface of the mask can be removed therefrom. Accordingly, the remaining conductive particles can be reused. Also, some of the conductive particles can be moved into the surfaces of the bumps while removing the conductive particles remaining on the surface of the mask. Accordingly, since it is possible to arrange a relatively larger number of the conductive particles on the surfaces of the bumps, the electronic part and the counterpart substrate are electrically connected to each other.

Also, the predetermined height of the mask is preferably a height such that the difference between the height of the mask and that of the bumps is larger than the diameter of the conductive particles. From the configuration above, when the conductive particles remaining on the surface of the mask are removed by the method above, there is not much possibility that the conductive particles arranged on the surfaces of the bumps are removed simultaneously during the removal operation. Accordingly, since it is possible to arrange a relative larger number of the conductive particles on the surfaces of the bumps, the electronic part and the counterpart substrate are electrically connected to each other.

Also, the method according to an aspect of the present invention may include a forming of a curable resin layer on the active surface of the wafer before the separating of the electronic part from the wafer. As the electronic part is adjusted into position on the counterpart substrate with heating and pressing, and as the curable resin layer is cured, the electric connection part between the electronic part and the counterpart substrate can be protected. Also, as a curable resin layer, which does not include conductive particles, is formed, it can reduce or prevent the neighboring electrode pads from shorting.

The electronic part according to an aspect of the present invention is manufactured by using a method of manufacturing the electronic part mentioned above. From the description, an aspect of the present invention can provide the electronic part exhibiting the effects mentioned above.

According to an aspect of the present invention, there is provided a method of mounting the electronic part mentioned above on a counterpart substrate, including curing a curable resin layer, together with pressing the electronic part, while positioning it on the counterpart substrate.

Also, an aspect of the present invention provides a method of mounting the electronic part mentioned above on a counterpart substrate, including curing a curable resin layer, together with pressing the electronic part, while positioning it on the counterpart substrate in which the curable resin layer is formed.

Also, an aspect of the present invention provides a method of mounting the electronic part mentioned above on a counterpart substrate, including curing a curable resin layer formed in a gap between the electronic part and the counterpart substrate, together with pressing the electronic part, while positioning it on the counterpart substrate.

From the configuration above, as the electronic part is adjusted into position on the counterpart substrate with heating and pressing, and as the curable resin is cured, the electric connection part between the electronic part and the counterpart substrate can be protected. Also, the curable resin layer, which does not include conductive particles, can reduce or prevent the neighboring electrode pads from shorting.

Also, the curable resin layer may be the thermosetting resin layer, and the curable resin layer may be heated at a temperature capable of melting the metal fixing the conductive particles on the surfaces of the bumps when the curable resin layer is cured.

Also, the curable resin layer may be the thermosetting resin layer, and the curable resin layer may be heated at a temperature capable of plasticizing the thermoplastic resin fixing the conductive particles on the surfaces of the bumps when the curable resin layer is cured.

From the configuration above, even though the conductive particles are stacked above the bumps, as the metal fixing the conductive particles is melted, or as a thermoplastic resin fixing the conductive particles is plasticized, the conductive particles become even such that they are arranged only on the surfaces of the bumps. Accordingly, the electronic part and the counterpart substrate are electrically connected to each other.

Meanwhile, according to an aspect of the present invention, an electronic apparatus manufactured by using the method of mounting the electronic part mentioned above is provided. From the description above, an aspect of the present invention can provide the electronic apparatus exhibiting the effects mentioned above.

BRIEF DESCRIPTION OF THE DRAWINGS

FIG. 1 is a schematic for explaining a mounting state of IC according to an exemplary embodiment of the present invention.

FIG. 3 is a side sectional along plane A—A of FIG. 2.

DETAILED DESCRIPTION OF EXEMPLARY EMBODIMENTS

Figure 2:
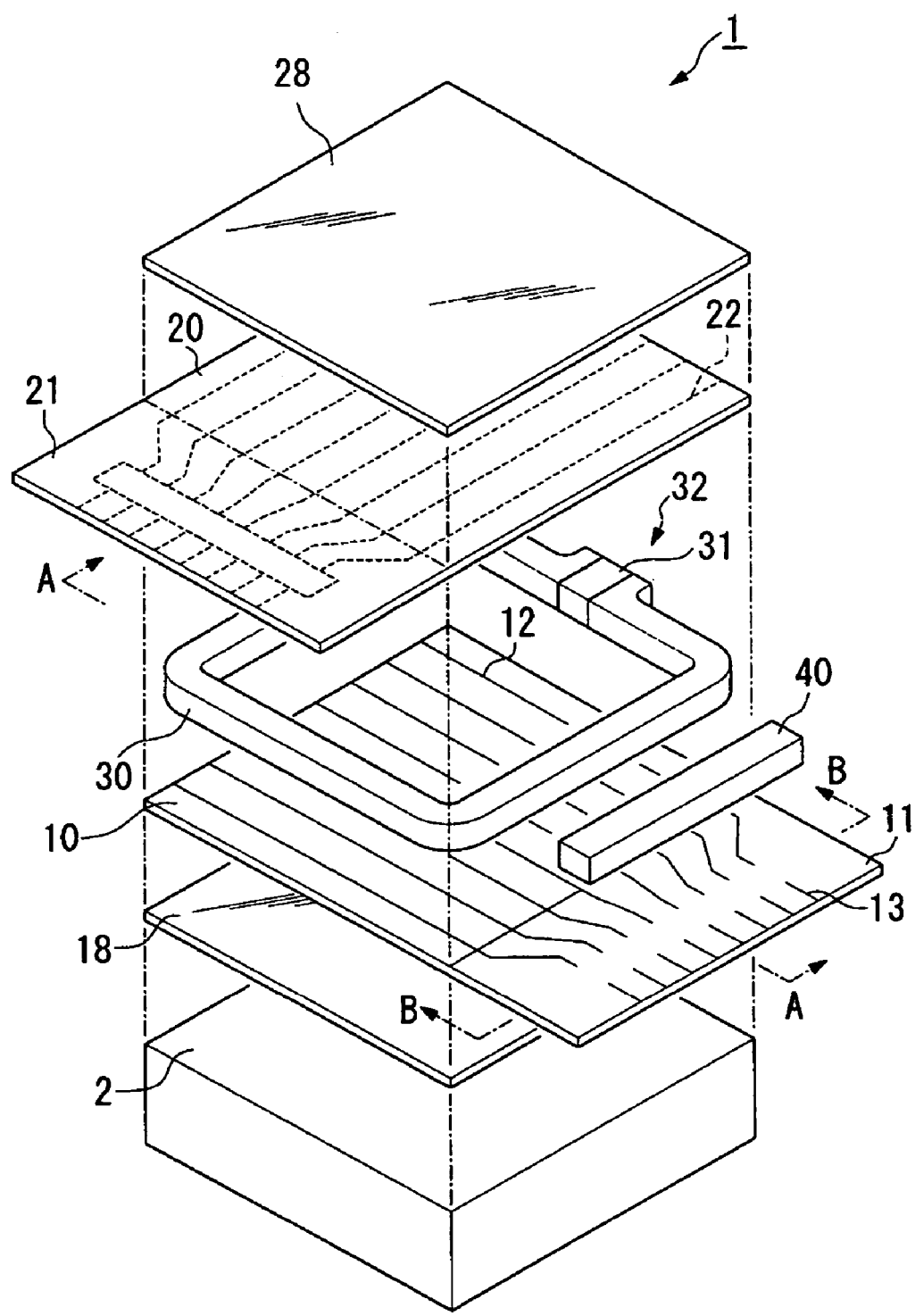
FIG. 2 is an exploded perspective of the liquid crystal display device according to an exemplary embodiment of the present invention.

Hereinafter, the exemplary embodiments of the present invention will be described in detail with reference to the drawings. Also, each element in the drawings is changed to appropriate scale such that it is legible.

Liquid Crystal Display Device

First, a liquid crystal display device using IC, an exemplary embodiment of the electronic part according to the present invention, will be explained below with reference to FIGS. 2 and 3. Also, FIG. 2 is an exploded perspective view of a liquid crystal display device, and FIG. 3 is a side sectional view along plane A—A of FIG. 2. Also, even though an aspect of the present invention is explained based on a passive matrix type liquid crystal display device as an exemplary embodiment thereof, it can be also adopted to an active matrix type liquid crystal display device.

As shown in FIG. 2, in the liquid crystal display device 1 as an exemplary embodiment of the present invention, a set of lower substrate 10 and upper substrate 20 made of transparent material, such as glass, etc., is arranged, in which the lower substrate and the upper substrate face each other. The interval between the substrates 10 and 20 is maintained at a distance of 5 µm, for example, which is defined by the diameter of the beads type spacer (not shown) positioned therebetween. The outer peripheries of both substrates 10 and 20 are connected with each other by sealing material 30 made of thermosetting type or ultraviolet setting type adhesive, etc. A liquid crystal injection port 32 protruding from both substrates 10 and 20 to the outside is installed to a portion of the sealing material 30. And, after the liquid crystal is injected into a space bounded by both substrates 10 and 20 and the sealing material 30 through the liquid crystal injection port 32, the liquid crystal injection port 32 is sealed by a closing member 31.

Also, an incident side polarizing plate 18 is arranged at the lower side of the lower substrate 10 and an output side polarizing plate 28 is arranged at the upper side of the upper substrate 20. Also, the incident side polarizing plate 18 and the output side polarizing plate 28 are arranged such that the polarizing axis (transparent axis) of the incident side polarizing plate 18 and the polarizing axis of the output side polarizing plate 28 are arranged to be crossed by 90°. Also, a backlight device 2 is arranged at the lower side of the incident side polarizing plate 18. And, if the light from the backlight device 2 is incident to the incident side polarizing plate 18, only linearly polarized light parallel to the polarizing axis of the incident side polarizing plate 18 passes through the incident side polarizing plate 18. The linearly polarized light passing through the incident side polarizing plate 18 rotates according to the arrangement of liquid crystalline molecules while it passes through the liquid crystal layer sandwiched by both substrates 10 and 20. In addition, the linearly polarized light transmitted by the liquid crystal layer passes through the output side polarizing plate 28 only if the axis of the linearly polarized light transmitted by the liquid crystal layer is coincident to that of the output side polarizing plate 28. Images are shown by the linearly polarized light passing through the output side polarizing plate 28.

In the inside of the upper substrate 20, the scanning electrodes 22 made of transparent conductive materials, such as ITO, etc., are formed as stripe type electrodes. In the inside of the lower substrate 10, the signal electrodes 12 made of transparent conductive materials, such as ITO, etc., are formed as stripe type electrodes. Also, the scanning electrodes 22 and the signal electrodes 12 are arranged to cross orthogonally, and the vicinity of the crossing point becomes a pixel region of the liquid crystal display device. And, when a scanning signal is input to a scanning electrode 22 and a data signal is input to a signal electrode 12, a voltage is applied to the liquid crystal layer between both electrodes 12 and 22, which is in the vicinity of the crossing point of both electrodes 12 and 22. Here, the arrangement of the liquid crystalline molecules is controlled according to the applied voltage level. Therefore, the rotation angle of the linearly polarized light incident to the liquid crystal layer is controlled, and thereby images are displayed on the liquid crystal display device 1.

FIG. 3 is a side sectional view along plane A—A of FIG. 2. Color filter layers 24r, 24g, and 24b, which correspond to Red (R), Green (G) and Blue (B), respectively, are formed in each pixel region of the inside of the upper substrate. Therefore, color images can be shown by the liquid crystal display device 1. Also, each light shielding film 25 is formed between the color filter layers 24r, 24g, and 24b, reducing or preventing light from coming through neighboring pixel regions. Also, scanning electrodes 22 are formed on each of the surfaces of the color filter layers 24r, 24g, and 24b, and an alignment film 26 is formed on the surface of the scanning electrode 22.

The signal electrode 12 is formed on the upper side of the lower substrate 10. Also, the overcoat film 15 is formed on the surface of the signal electrode 12, and an alignment film 16 of the liquid crystalline molecules is formed on the surface of the overcoat film 15. The alignment state of the liquid crystalline molecules in the case of not applying a voltage is defined by the alignment film 16. Also, each of the alignment films 16 and 26 is formed so that the aligned direction of liquid crystalline molecules by the alignment film 26 of the upper substrate 20 and that of liquid crystalline molecules by the alignment film 16 of the lower substrate 10 are crossed by 90°.

Here, the lower substrate 10 is formed to protrude with respect to the side of the upper substrate 20, and each signal electrode 12 is formed to be extended on the protruding portion 11. Also, a wire pattern 13 is formed on the end of the protruding portion to connect the liquid crystal display device 1 with the other substrate. And, a driving IC 40 for driving each signal electrode 12 based on a signal from the other substrate is mounted between each wire pattern 13 and each signal electrode 12. Similarly, as shown in FIG. 2, a protruding portion 21 is formed on the upper substrate 20, each scanning electrode 22 is formed to be extended on the protruding portion 21, and a driving IC 40 for driving each scanning electrode 22 is mounted.

Mounting Structure of Driving IC

FIG. 1 is a view for explaining the mounting state of the driving IC 40 as an exemplary embodiment of the electronic part according to an aspect of the present invention, which is a front sectional view along plane B—B of FIG. 2. On the active surface of the driving IC (hereinafter referred to as IC) 40, a plurality of electrode pads 42 made of conductive material, such as Al, etc. are formed with a predetermined pitch. Also, on the surface of each electrode pad 42, bumps 44 are formed by Au plating, Au/Ni plating, etc. For example, each bump 44 is formed with 30 μm wide, the neighboring bumps 44 are arranged to be approximately 10 μm apart, and each bump pitch is about 40 μm.

Also, a plurality of conductive particles 50 are arranged on the surface of each bumps 44. The conductive particles 50 are formed as the surface of resin balls, etc. is stepped by a solder coat or a metal plating. The metal plating adopts an electrolytic Au plating or an electroless Ni plating etc. The lower portion may be performed by electroless Ni plating and the upper portion by electrolytic Au plating. The conductive particles 50 are formed to have a diameter of about 4.5 μm, for example. Also, the conductive particles 50 are fixed on the surfaces of the bumps 44 using thermoplastic resin 80, such as polyamide, etc.

An electrode pad 12 is formed on the surface of the lower substrate 10 so that it faces the electrode pad 42 of the IC 40. Also, the electrode pad 12 is formed in the end portion of the signal electrode 12 in the protrusion portion 11 of the lower substrate 10, as shown in FIG. 2. The IC 40 is arranged to face the lower substrate 10. Here, the end of the conductive particles 50 fixed on the IC 40 contacts the surface of the electrode pad 12 of the lower substrate 10, and thereby the IC 40 is electrically connected to the signal electrode of the lower substrate 10. Also, a thermosetting resin layer 90 made of epoxy resin, etc. is arranged between the IC 40 and the lower substrate 10, so that the IC 40 and the lower substrate 10 are mechanically connected to each other. Also, the active surface of the IC 40 and the electrical connection portion between the IC 40 and the lower substrate 10 are protected by the thermosetting resin layer 90.

Exemplary Manufacturing Method

Referring to FIGS. 4 to 6, an IC manufacturing method according to the exemplary embodiment of the present invention will be explained below. FIGS. 4 to 6 are views for explaining the IC manufacturing method, in which the active surface of the IC was the upper surface. The present exemplary embodiment performs the following simultaneously steps with respect to the multiple ICs formed on a wafer and separates the ICs from the wafer during the final step. Therefore, the manufacturing cost can be reduced.

Figure 4A:
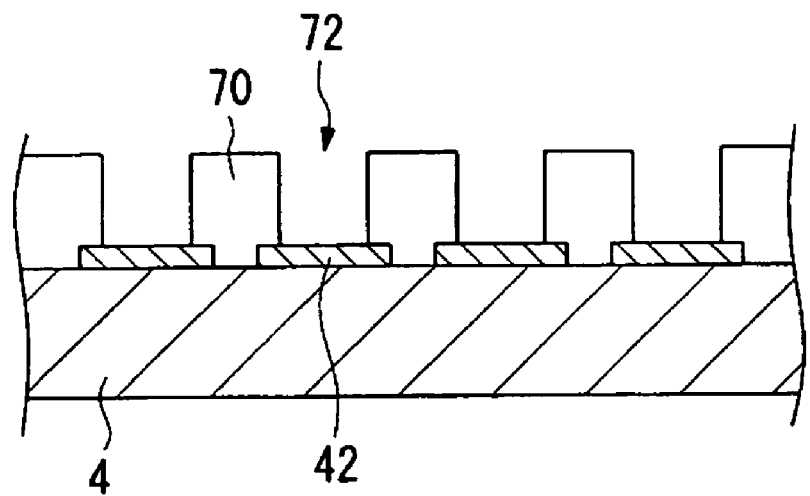
FIGS. 4(A)–4(C) are schematics for explaining an IC manufacturing method.

First of all, as shown in FIG. 4(A), a mask is formed to form a bumps 44. Also, since the bumps 44 is formed on the electrode pad 42 of the IC 40, the mask is formed on the active surface of a wafer 4 in which the electrode pad 42 was formed. The mask includes resist 70. The specific sequence is that the entire active surface is first coated with resist 70. The resist 70 may be a photoresist, an electron beam resist or an X-ray resist, and may be positive type or negative type. The resist may have a tolerance with respect to the plating liquid, which will be explained later. For example, a phenol novolak resin may be used as the resist 70.

The resist 70 is coated by a spin coat method, a dipping method, a spray coat method, etc. Here, the thickness of the resist 70 is to be greater than the height of the bump 44 to be formed plus the diameter of the conductive particles 50. For example, the resist 70 is formed so that the difference between the height of the resist 70 and the height of the bump 44 is about 10 μm. Also, after coating the resist 70, a pre-baking step is performed.

Next, the planform of the bump 44 to be formed is patterned to the resist 70. Specifically, an opening 72 corresponding to the planform of the bump 44 is formed above the electrode pad 42 between the neighboring resist 70. Also, the planform of the bump 44 is not limited to a rectangule, and may be implemented as a circle etc. The resist patterning is performed by first exposing the resist 70 to a light using a patterned photomask and then developing the further exposed resist 70. Also, after the resist 70 is patterned, a post-bake step is performed.

The foregoing description has explained a method of forming the resist 70 using photolithography technology. In addition to the method, the resist 70 with a patterning state may be formed using a dry film or a printing method, such as screen print, etc., for example. Also, the resist 70 may be formed under the patterning state, a droplet of the resist being ejected only on proper locations to form the resist 70 using a droplet ejection apparatus, such as an ink jet device etc. Thereby, the method does not need the photomask used in photolithography and can reduce the manufacturing cost.

Figure 4B:
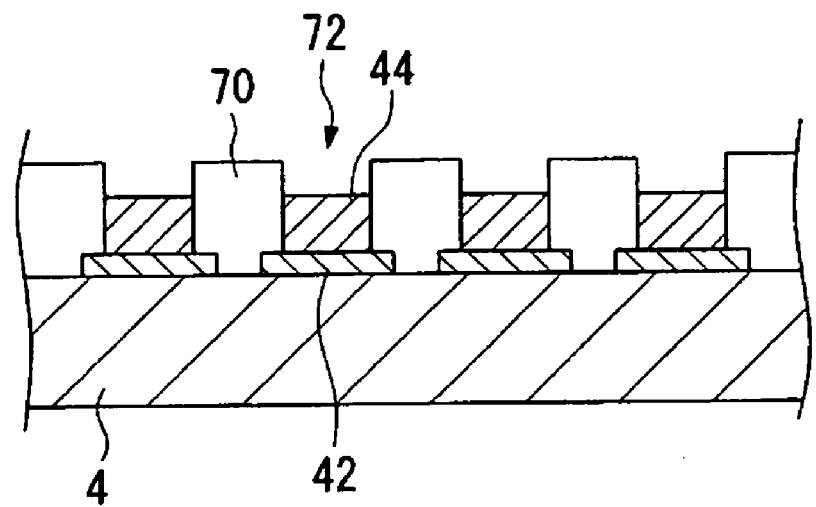

Next, as shown in FIG. 4(B), the bumps 44 are formed as the openings 72 are filled with the conductive materials with the resist 70 functioning as the mask. The bumps 44 are formed by Au plating, Ni plating, etc. Also, the lower portions of the bumps 44 may be formed by Ni plating and the upper portions may be formed by Au plating. Also, an electrochemical plating (ECP) method, etc. may be used as the plating method. Also, the electrode pad 42 may be used as an electrode for the plating method. In addition to the plating method, the conductive material may be filled therewith by a CVD method or sputtering method. Here, the height of the bump 44 is preferably not more than the thickness of the resist 70 minus the diameter of the conductive particles 50.

Figure 4C:
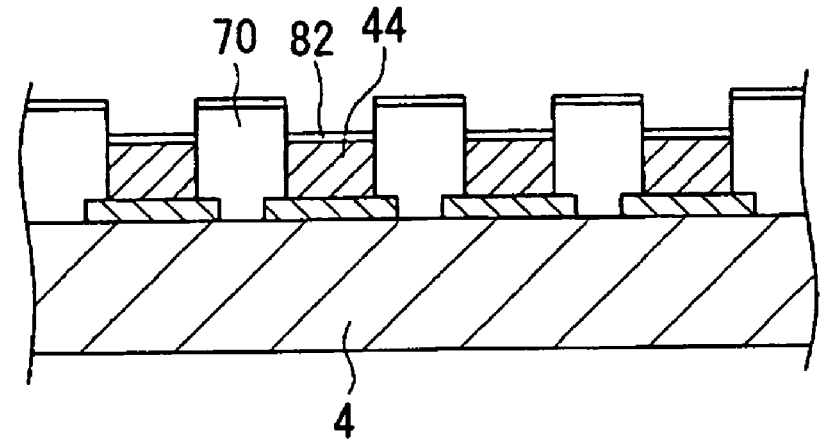

Next, as shown in FIG. 4(C), a film 82 of thermoplastic resin, such as polyamide etc., is formed on the surfaces of the bumps 44. The thickness of the thermoplastic resin film 82 is preferably about a half of the diameter of the conductive particles 50. The thermoplastic resin film 82 is applied by first dissolving a thermoplastic resin, such as polyamide, etc. in a solvent, such as toluene/ethanol, etc to form a thermoplastic resin solution and then coating the thermoplastic resin solution onto the active surface of the IC 40. Thereby, the thermoplastic resin is simply coated thereon.

The coating of the thermoplastic resin solution is performed by a dispense method, spray coat method, spin coat method, dipping method, etc. In this case, since the thermoplastic resin solution is applied to the surface of the resist 70 in addition to the surfaces of the bumps 44, the thermoplastic resin film 82 is also formed on the surface of the resist 70. Here, when using the droplet ejection apparatus, such as an ink jet apparatus etc., a predetermined amount of the thermoplastic resin solution can be ejected only on the surfaces of the bumps 44. Thereby, the state of fixing the conductive particles on the surfaces of the bumps is even. Therefore the IC and the lower substrate can be electrically connected to each other.

Next, the coated thermoplastic resin solution is dried to evaporate the solvent therefrom. Then, the thermoplastic resin dissolved in the solvent is condensed and the thermoplastic resin film 82 is formed. From the preceding description, a state shown in FIG. 4(C) is attained.

Figure 5A:
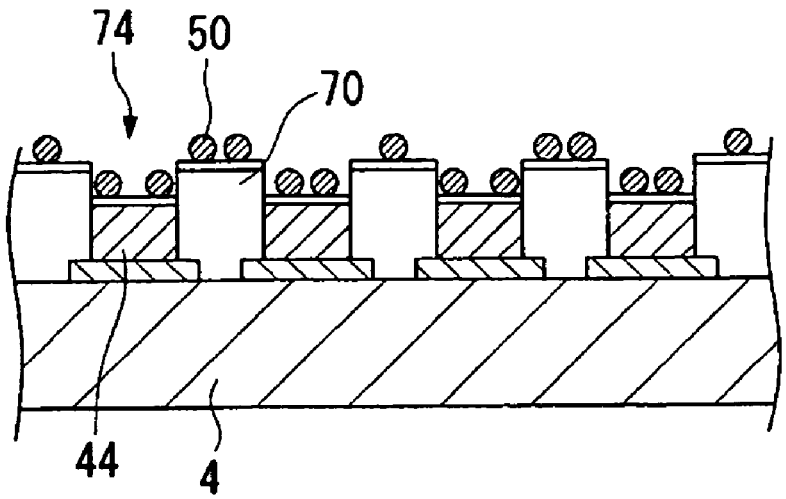
FIGS. 5(A)–5(C) are schematics for explaining an IC manufacturing method.

Next, as shown in FIG. 5(A), the conductive particles 50 are scattered on the active surface of the wafer 4. The scattered conductive particles 50 are distributed and arranged above the bumps 44 and the resist 70. Here, since the thickness of the bump 44 is formed not more than the height of the resist 70, depressed portions 74 are formed above the bumps 44. Therefore, most of the scattered conductive particles 50 are held in the depressed portions 74. Thereby, the conductive particles are certainly arranged above the surfaces of the bumps.

Figure 5B:
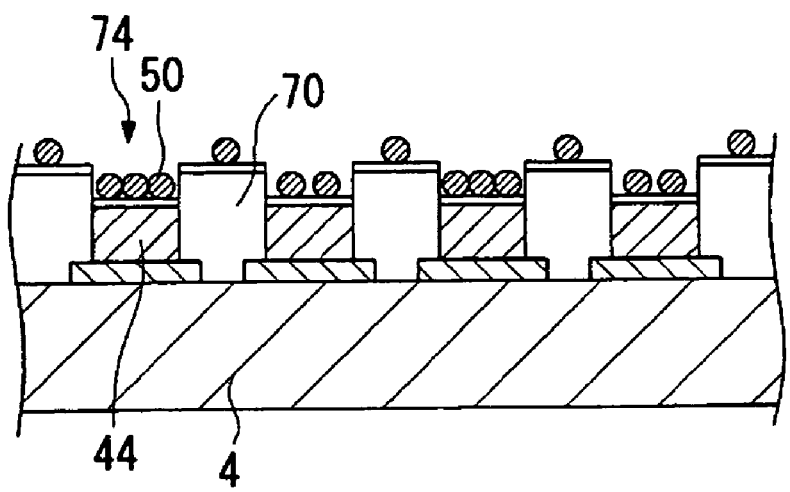

Next, as shown in FIG. 5(B), the conductive particles 50 arranged above the resist 70 drop into the depressed portions 74 as the wafer 4 is vibrated, and thereby a relatively large number of conductive particles are arranged above the bumps. Specifically, the wafer 4 is vibrated at a high frequency of 50 to 1000 Hz. In particular, when the wafer is vibrated at a high frequency of 250 to 500 Hz, the conductive particles 50 move actively. Thereby a relatively large number of conductive particles can be arranged above the bumps. Also, the vibration direction of the wafer 4 may be parallel to the active surface of the wafer 4 (lateral direction) or perpendicular to the active surface thereof (vertical direction). In the case of lateral vibration, the amplitude thereof is preferably less than the pitch of the neighboring bumps 44, for example, 40 μm. In the case of vertical vibration, the amplitude is preferably less than the depth of the depressed portion 74, for example, 10 μm. Thereby, the conductive particles 50 held in the depressed portion 74 can be reduced or prevented, from escaping from the depressed portion 74.

Figure 5C:
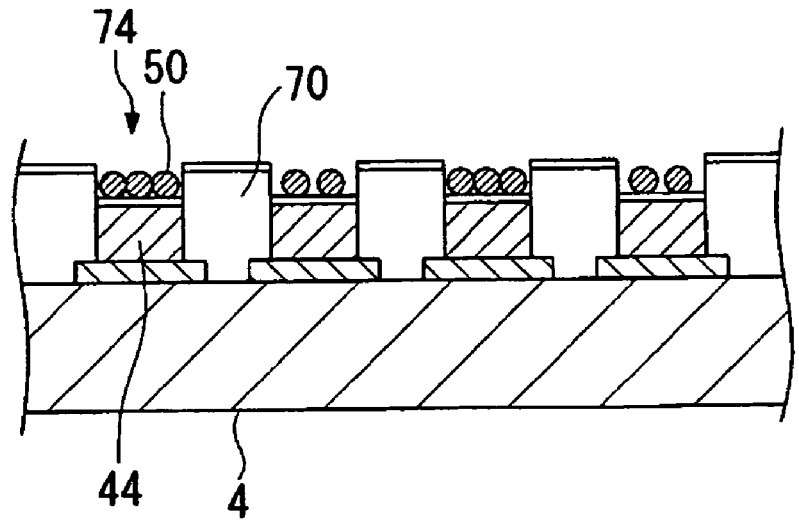

Next, as shown in FIG. 5(C), the conductive particles 50 remaining above the resist 70 are removed. The removal of the conductive particles 50 may be performed by: a method to blow the conductive particles 50 as gas is blown on the active surface of the wafer 4; a method to drop the conductive particles 50 from the periphery of the wafer 4 as the wafer 4 is vibrated; a method to drop the conductive particles 50 from the periphery of the wafer 4 as the wafer 4 is vibrated while sloping the wafer 4, and/or a method to forcibly remove the conductive particles 50 as the conductive particles 50 are scraped off by a squeegee which is shaped as a plane and has flexibility. Most of the conductive particles 50 remaining on the surface of the resist 70 can be removed by any one of the methods above. Also, while removing the conductive particles remaining on the surface of the resist 70, a portion of the conductive particles can be made to drop into the depressed portion. Therefore, a relatively large number of conductive particles can be arranged in the surfaces of the bumps.

Also, even if the wafer 4 is vibrated to drop the conductive particles 50 into the depressed portion 74 in the earlier step, the second or third methods described above may obtain the same result by gradually increasing the amplitude of the vibration. Thereby, the manufacturing step can be simply implemented.

Here, the thickness of the resist is equal to or more than the diameter of the conductive particles 50 plus the height of the bumps 44. Therefore, the conductive particles 50 above the bumps 44 can be stably held in the depressed portions 74. Accordingly, no matter which one of the removal methods mentioned above is adopted, only the conductive particles 50 arranged above the resist 70 will be removed, while the conductive particles 50 arranged above the bumps 44 cannot be removed. Thereby, when the conductive particles 50 remaining above the resist 70 are removed, the state shown in FIG. 5(C) can be implemented.

Figure 6A:
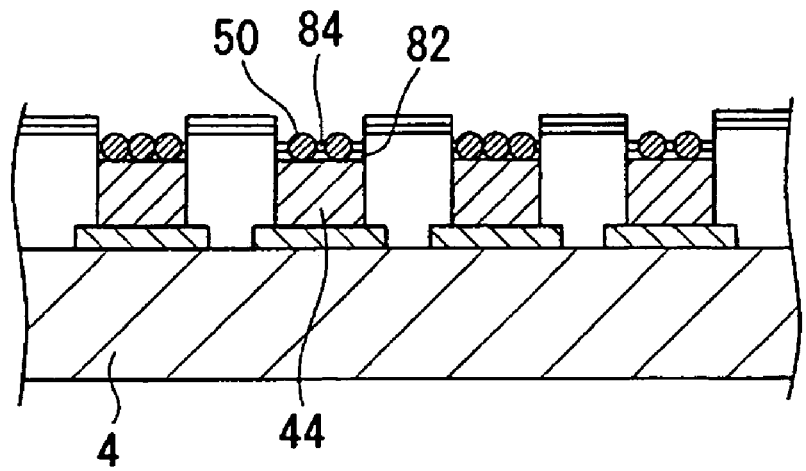
FIGS. 6(A)–6(C) are schematics for explaining an IC manufacturing method.

Next, as shown in FIG. 6(A), a thermoplastic resin solution 84 is coated on the bumps 44. The thermoplastic resin solution 84 is the same as the solution mentioned above, and is prepared by dissolving a thermoplastic resin, such as polyamide, etc., in a solvent, such as toluene/ethanol etc. The coating method may be the same as the method mentioned above. The upper side of the resist 70 in addition to the upper side of the bumps 44 may be coated. Also, the coating thickness preferably equals to about a half of the diameter of the conductive particles 50. When the thermoplastic resin solution 84 is coated, the solvent included in the thermoplastic resin solution 84 penetrates to the thermoplastic resin film 82 previously formed. Thereby, the thermoplastic resin film 82 is dissolved again, and then integrated with the thermoplastic resin solution 84. Then, the thermoplastic resin solution 84 wets along the surfaces of the conductive particles 50, and the conductive particles 50 are sunken within the thermoplastic resin film 82 and arranged on the surfaces of the bumps 44.

Figure 6B:
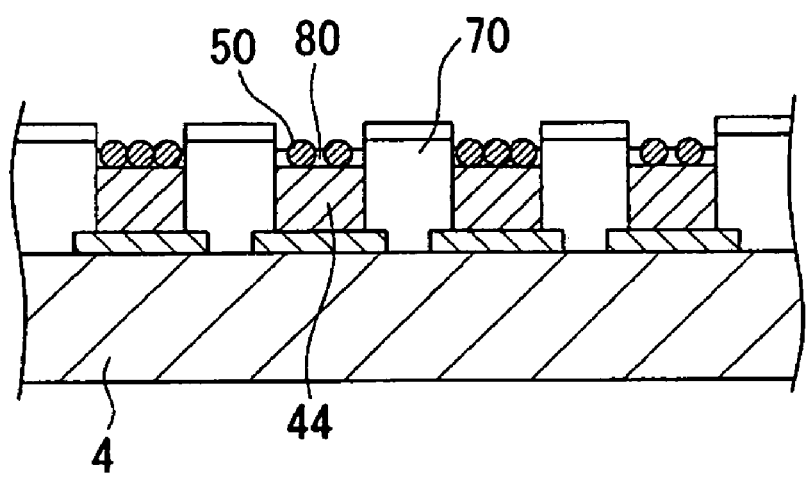

Next, as shown in FIG. 6(B), the thermoplastic resin solution 84 is dried, the thermoplastic resin layer 80 is formed, and the conductive particles 50 are fixed on the surfaces of the bumps 44. Specifically, heat with 50° C. is applied, the solvent, such as toluene/ethanol, etc., included in the thermoplastic resin solution 84 is evaporated, and the thermoplastic resin included in the thermoplastic resin solution 84 is condensed. Also, heating for 10 minutes under 200° C. is preferably performed. Thereby, the thermoplastic resin of the thermoplastic resin film 82 previously formed, and the thermoplastic resin of the thermoplastic resin solution 84 coated later, are melted and stuck to each other, and thereby the fixing force of the conductive particles 50 is enhanced. From the preceding description, the thermoplastic resin layer 80 is formed, and the conductive particles 50 are fixed on the surfaces of the bumps 44 by the thermoplastic resin.

As mentioned above, the conductive particles 50 can be fixed to the surfaces of the bumps 44 as the thermoplastic resin is applied twice. Thereby, when the resist 70 is removed, the conductive particles 50 arranged on the bumps 44 together with the thermoplastic resin layer 80 are not taken away from the bumps 44. Also, the method to fix the conductive particles 50 mentioned above may be performed while pressing the conductive particles 50 toward the surfaces of the bumps 44. Thereby, the conductive particles 50 are fixed on the surfaces of the bumps 44 while in contact, such that they are electrically connected to the bumps.

Figure 6C:
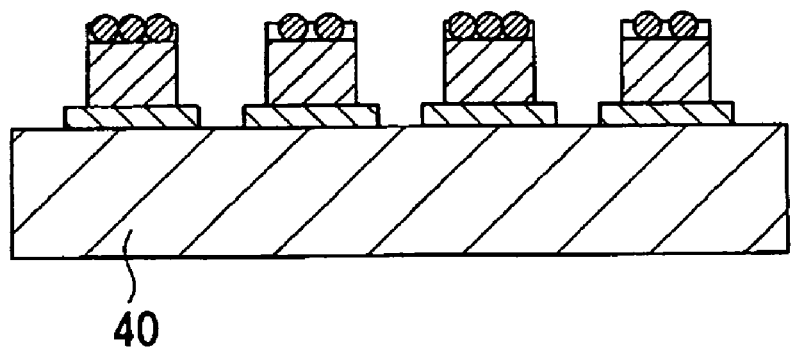

Next, as shown in FIG. 6(C), the resist 70 is removed. The removal of the resist 70 is performed as the wafer 4 is immersed in the resist removal solution. The resist removal solution may be a solution prepared by mixing monoethanolamine and dimethyl sulfoxide with a ratio of 7 to 3. When the resist 70 is removed, the thermoplastic resin layer 80 formed on the resist is simultaneously removed. As mentioned above, since the resist is exfoliated after the conductive particles scattered above the resist are removed, the removed conductive particles can be reused.

Next, the IC 40 is separated from the wafer 4 by dicing etc. From the description mentioned above, as shown in FIG. 6(C), the IC according to the exemplary embodiment of the present invention is formed.

With reference to FIG. 7, the mounting method of the IC according to the exemplary embodiment of the present invention will be explained below. FIG. 7 is a view for explaining a mounting method of the IC according to an exemplary embodiment of the present invention.

Figure 7A:
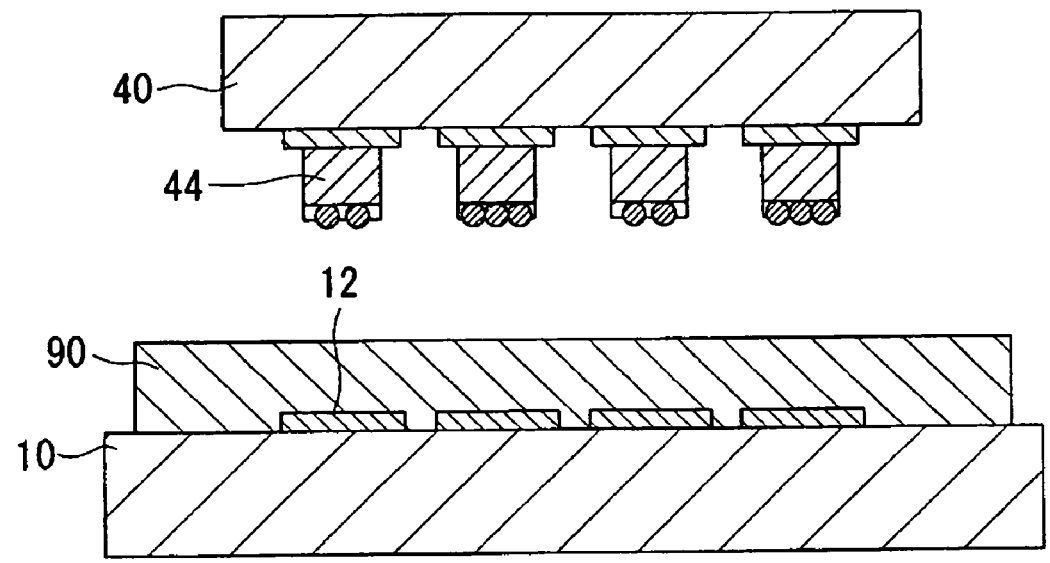
FIGS. 7(A) and 7(B) are schematics for explaining an IC mounting method.

As shown in FIG. 7(A), first, a thermosetting resin layer 90 is formed on the surface of the lower substrate 10. The formation of the thermosetting resin layer 90 is performed as an uncured epoxy resin film is attached thereto. Also, the thermosetting resin layer 90 may be formed as an uncured epoxy resin paste is coated onto the surface of the lower substrate 10. Also, the thermosetting resin layer 90 may be formed on the active surface. In this case, the IC 40 is separated from the wafer 4 after the thermosetting resin layer 90 is formed on the active surface of the wafer. In addition, after the IC 40 is mounted on the lower substrate 10, the thermosetting resin layer 90 may be formed as an underfill is filled with the gap between the IC 40 and the lower substrate 10. Also, in any case, it is important to note that unlike the anisotropic conductive resin, the conductive particles are not included in the thermosetting resin layer 90.

After turning over the IC 40 formed as above, the IC is arranged on the upper side of the lower substrate 10. At this time, the IC 40 and the lower substrate 10 are arranged, so that the bumps 44 formed in the IC 40 and the electrode pads 12 formed in the lower substrate 10 face each other.

Figure 7B:
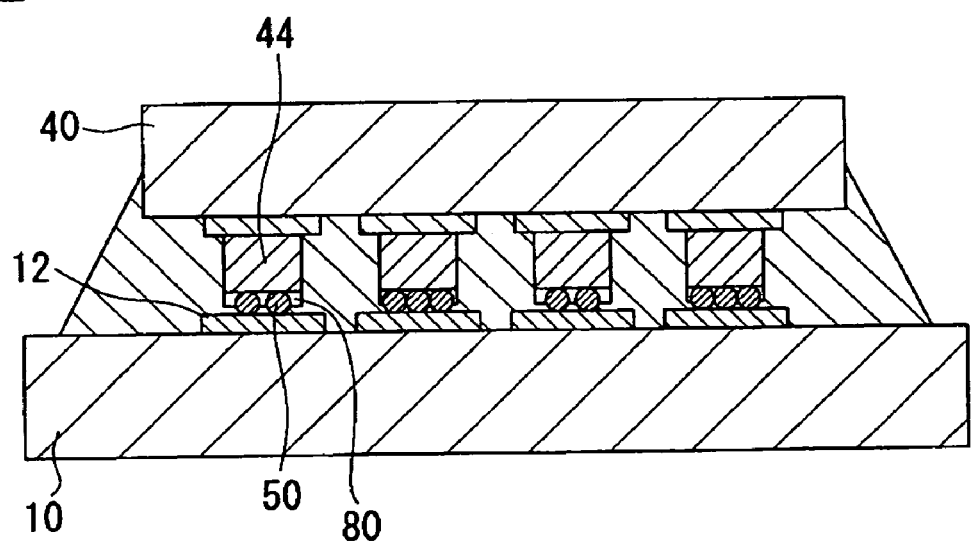

Next, as shown in FIG. 7(B), the IC 40 is tightly pressed onto the surface of the lower substrate 10. Thereby, the conductive particles 50 fixed on the bumps 44 of the IC 40 contact the electrode pad 12 of the lower substrate 10 such that they are electrically connected to each other. And, under this state, the thermosetting resin layer 90 is heated. The heating temperature is 200° C., for example. Also, when the IC 40 is pressing toward the lower substrate 10, at the same time, the thermosetting resin layer 90 may be heated. Thereby, the thermosetting resin layer 90 is cured, and the IC 40 and the lower substrate 10 are mechanically connected to each other. Also, the electrical connection portion between the IC 40 and the lower substrate 10 is protected.

Also, the thermoplastic resin layer 80 fixing the conductive particles 50 to the bumps becomes soft at about 150° C. In addition, since the IC 40 is pressed to the lower substrate 10, even when the conductive particles 50 are stacked on the surfaces of the bumps 44, the conductive particles 50 are arranged only on the surfaces of the bumps 44 after the conductive particles become even. Also, even when the thermoplastic resin layer 80 is interposed between the bumps 44 and the conductive particles 50, since the thermoplastic resin layer 80 becomes soft, the conductive particles 50 can contact the surfaces of the bumps 44. In addition, even when the thermoplastic resin layer 80 is interposed between the conductive particles 50 and the electrode pad 12 of the lower substrate 10, since the thermoplastic resin layer 80 becomes soft, the conductive particles 50 can contact the electrode pad 12. Accordingly, the IC 40 and the lower substrate 10 are electrically connected to each other. In this way, the IC 40 is mounted in the lower substrate 10.

Recently, as electronic parts become smaller, the electrode pads must be arranged with a finer pitch. In this case, since the conductive particles are not included in the thermosetting resin layer 90 mentioned above, the danger of a short between the neighboring electrode pads is greatly reduced. Also, since it is mounted after the conductive particles are previously fixed on the surfaces of the bumps 44, even though the electrode pads are smaller, it can be electrically connected to the electrode pad on the counterpart substrate.

In addition, in an exemplary embodiment of the present invention, even if the conductive particles are scattered on the surface of the resist, since the resist is exfoliated after the conductive particles are removed, the removed conductive particles can be reused. Thereby, without throwing away the expensive conductive particles, all of the elements can be used for electrical connection. Also, since the thickness of the resist is thicker than the height of the bumps in the exemplary embodiment of the present invention, depressed portions are formed above the bumps using the resist as a mask to form the bumps. In this case, since most of the scattered conductive particles are held in the depressed portions, the conductive particles can be certainly arranged on the surfaces of the bumps. Therefore, the IC and the lower substrate can be electrically connected to each other.

Also, when the anisotropic conductive film (ACF) is arranged between the IC and the lower substrate, as in the related art, the number of conductive particles arranged between the bumps of the IC and the electrode pad of the lower substrate is about 10 to 20. And, if the number of the conductive particles is increased above that number, it is necessary to increase the density of the conductive particles incorporated into the ACF, but the possibility of a short between neighboring electrode pads increases. With respect to this, when the IC is manufactured by using the method of manufacturing the electronic part according to the exemplary embodiment of the present invention, a plurality of conductive particles are arranged on the surfaces of the bumps. The conductive particles may be in contact with over 80% of the surface area of the bumps, for example. Thereby, since the electrical resistance between the bumps of the IC and the electrode pad of the lower substrate decreases, the power consumption of the liquid crystal display device can be reduced. In this case, the neighboring electrode pads are not shorted to each other, which is the same as the description above.

Also, even though the exemplary embodiment of the present invention has disclosed that the invention may be adopted to Chip On Glass (COG) mounting of the IC to a glass substrate, the present invention may also be adopted to Chip On Film (COF) mounting of the IC to a resin film substrate etc.

Electronic Apparatus

Figure 8:
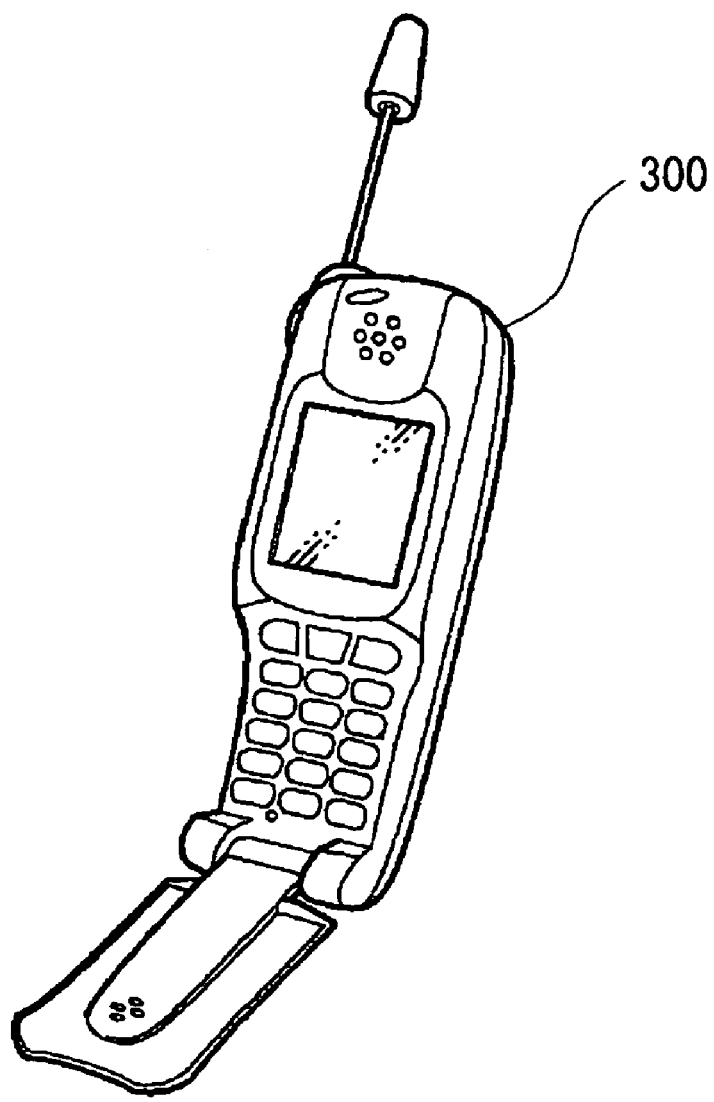
FIG. 8 is a perspective view of a mobile phone.
Figure 9A:
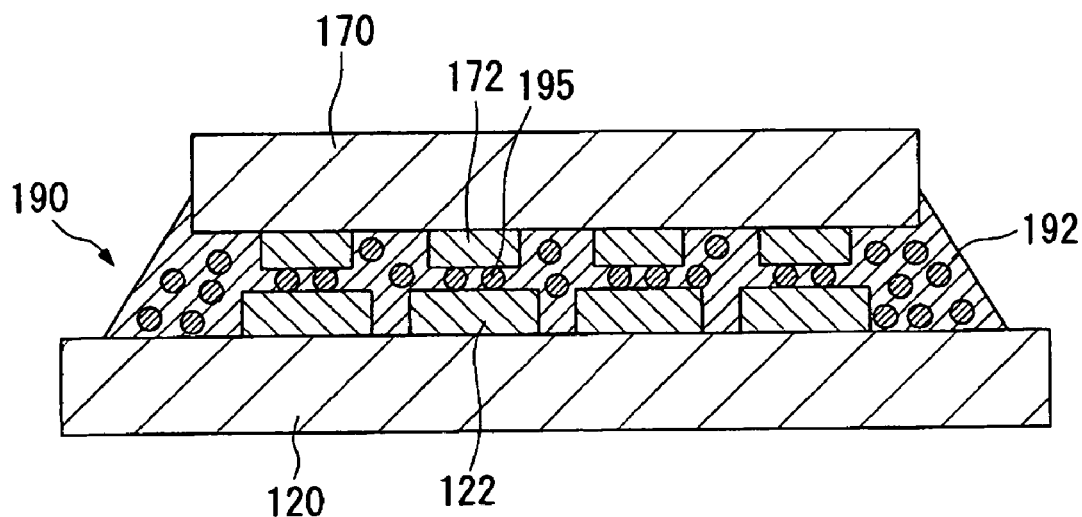
FIGS. 9(A) and 9(B) are views for explaining a method of mounting electronic part according to the related art.
Figure 9B:
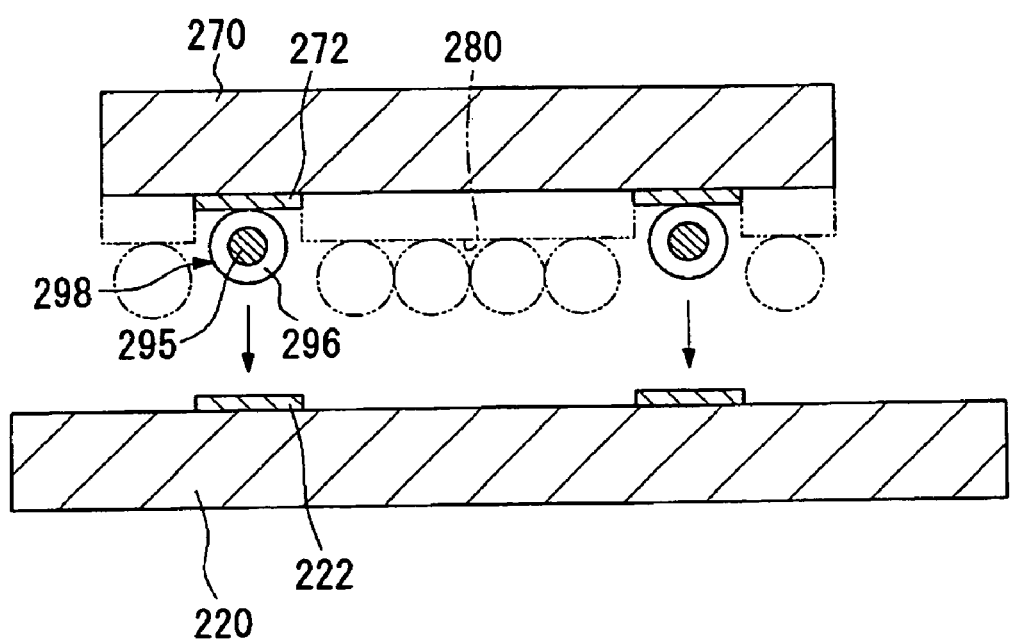

With reference to FIG. 8, an electronic apparatus having the liquid crystal display device according to an exemplary embodiment of the present invention will be explained below. FIG. 8 is a perspective view of a mobile phone. The liquid crystal display device is installed into the inside of the case of the mobile phone 300, and included therein as a liquid crystal display unit.

Also, in addition to the mobile phone, the liquid crystal display device mentioned above can be adopted to various electronic apparatus. It can be adopted to the following electronic apparatus, for example, a liquid crystal projector, a personal computer (PC) corresponding to multimedia and engineering workstation (EWS), a pager, a word processor, a television, a video cassette recorder of view finder type or monitor direct viewing type, an electronic note, electronic desk calculator, a car navigation apparatus, POS terminal, an apparatus having touch panel etc.

What is claimed is:

1. A method of manufacturing an electronic part from a wafer, comprising:
    forming a mask on an active surface of the wafer on which electrode pads for the electronic part are formed, the mask being of a predetermined height and having openings provided above the electrode pads,
    forming bumps inside of the openings of the mask provided above the electrode pads, the bumps having a height lower than that of the mask,
    scattering conductive particles on the active surface of the wafer,
    removing the conductive particles remaining on the surface of the mask,
    fixing the conductive particles on the surfaces of the bumps,
    removing the mask, and
    separating the electronic part from the wafer.

2. The method according to claim 1, further comprising:
    forming a metal film on the surfaces of the bumps before the scattering of the conductive particles,
    the fixing of the conductive particles on the surfaces of the bumps including fixing the conductive particles on the surfaces of the bumps by solidifying the metal after melting thereof.

3. The method according to claim 1, further comprising:
    coating a plastic resin on the surfaces of the bumps before the scattering of the conductive particles,
    the fixing of the conductive particles on the surfaces of the bumps including fixing the conductive particles on the surfaces of the bumps by curing the plastic resin after plasticizing thereof.

4. The method according to claim 1, further comprising:
    coating a curable resin on the surfaces of the bumps before the scattering of the conductive particles,
    the fixing of the conductive particles on the surfaces of the bumps including fixing the conductive particles on the surfaces of the bumps by curing the curable resin.

5. The method according to claim 2,
    the fixing of the conductive particles on the surfaces of the bumps performed while pressing the conductive particles against the surfaces of the bumps.

6. The method according to claim 1, further comprising:
    coating a liquid material containing a metal on the surfaces of the bumps after the scattering of the conductive particles,
    the fixing of the conductive particles on the surfaces of the bumps including fixing the conductive particles on the surfaces of the bumps by solidifying the metal.

7. The method according to claim 1, further comprising:
    coating a plastic resin on the surfaces of the bumps after the scattering of the conductive particles,
    the fixing of the conductive particles on the surfaces of the bumps including fixing the conductive particles on the surfaces of the bumps by curing the plastic resin.

8. The method according to claim 1, further comprising:
    coating a curable resin on the surfaces of the bumps after the scattering of the conductive particles,
    the fixing of the conductive particles on the surfaces of the bumps including fixing the conductive particles on the surfaces of the bumps by curing the curable resin.

9. The method according to claim 1, further comprising:
    forming a metal film on the surfaces of the bumps before the scattering of the conductive particles, and
    coating a liquid material containing the metal on the surfaces of the bumps after the scattering of the conductive particles,
    the fixing of the conductive particles on the surfaces of the bumps including fixing the conductive particles on the surfaces of the bumps by solidifying the metal after melting thereof.

10. The method according to claim 1, further comprising:
    coating a plastic resin on the surfaces of the bumps before the scattering of the conductive particles, and
    coating the plastic resin on the surfaces of the bumps after the scattering of the conductive particles,
    the fixing of the conductive particles on the surfaces of the bumps including fixing the conductive particles on the surfaces of the bumps by curing the plastic resin after plasticizing thereof.

11. The method according to claim 1, further comprising:
    coating a curable resin on the surfaces of the bumps before the scattering of the conductive particles, and
    coating the curable resin on the surfaces of the bumps after the scattering of the conductive particles, the fixing of the conductive particles on the surfaces of the bumps including fixing the conductive particles on the surfaces of the bumps by curing the curable resin.

12. The method according to claim 9,
the fixing of the conductive particles on the surfaces of the bumps performed while pressing the conductive particles against the surfaces of the bumps.

13. The method according to claim 3,
the coating of the plastic resin or the curable resin including coating the liquid material which is prepared by dissolving the plastic resin or the curable resin in a solvent, and
the solvent being evaporated after the coating of the plastic resin or the curable resin.

14. The method according to claim 13,
the curable resin being a cured curable resin.

15. The method according to claim 3,
the coating of the plastic resin or the curable resin including coating the liquid material containing the plastic resin or the curable resin on the bumps by a droplet ejection apparatus.

16. The method according to claim 1,
the scattering the conductive particles including scattering the conductive particles coated with a metal, and
the fixing of the conductive particles on the surfaces of the bumps including fixing the conductive particles on the surfaces of the bumps by solidifying the metal after melting thereof.

17. The method according to claim 1,
the scattering of the conductive particles including scattering the conductive particles coated with a plastic resin, and
the fixing of the conductive particles on the surfaces of the bumps including fixing the conductive particles on the surfaces of the bumps by curing the plastic resin after plasticizing thereof.

18. The method according to claim 1,
the scattering of the conductive particles including scattering the conductive particles coated with an uncured curable resin, and
the fixing of the conductive particles on the surfaces of the bumps including fixing the conductive particles on the surfaces of the bumps by curing the curable resin.

19. The method according to claim 1,
wherein the scattering of the conductive particles including scattering the conductive particles coated with a cured curable resin, and
the fixing of the conductive particles on the surfaces of the bumps including fixing the conductive particles on the surfaces of the bumps by coating a solvent capable of dissolving the curable resin.

20. The method according to claim 3,
the plastic resin being a thermoplastic resin.

21. The method according to claim 4,
the curable resin being a thermosetting resin.

22. The method according to claim 4,
the curable resin being a photo-curable resin.

23. The method according to claim 1, further comprising:
moving the conductive particles scattered on the surface of the mask to the surfaces of the bumps by vibrating the wafer after the scattering of the conductive particles.

24. The method according to claim 23,
the vibrating of the wafer includes vibrating the wafer at a frequency of 50 Hz to 1000 Hz.

25. The method according to claim 23,
the vibrating of the wafer including vibrating the wafer in parallel to the active surface of the wafer with an amplitude of not more than the width of the openings in the mask.

26. The method according to claim 23,
the vibrating of the wafer including vibrating the wafer perpendicularly to the active surface of the wafer with an amplitude of not more than the difference between the height of the mask and that of the bump.

27. The method according to claim 1,
the removing of the conductive particles remaining on the surface of the mask including removing the conductive particles remaining on the surface of the mask by blowing gas on the active surface of the wafer.

28. The method according to claim 1,
the removing of the conductive particles remaining on the surface of the mask including removing the conductive particles remaining on the surface of the mask by vibrating the wafer.

29. The method according to claim 1,
the removing of the conductive particles remaining on the surface of the mask including removing the conductive particles remaining on the surface of the mask by vibrating the wafer while it is sloped.

30. The method according to claim 1,
the removing of the conductive particles remaining on the surface of the mask including removing the conductive particles as the conductive particles remaining on the surface of the mask are scraped off.

31. The method according to claim 1,
the predetermined height of the mask being a height such that the difference between the height of the mask and that of the bumps is larger than the diameter of the conductive particles.

32. The method according to claim 1, further comprising:
forming a curable resin layer on the active surface of the wafer before the separating of the electronic part from the wafer.

* * * * *